United States Patent [19]
Santhanam et al.

[11] Patent Number: 5,395,680
[45] Date of Patent: * Mar. 7, 1995

[54] COATED CUTTING TOOLS

[75] Inventors: Anakkavur T. Santhanam, Monroeville; Rajendra V. Godse, Greensburg; Dennis T. Quinto, Greensburg; Kenneth E. Undercoffer, Greensburg; Prem C. Jindal, Greensburg, all of Pa.

[73] Assignee: Kennametal Inc., Latrobe, Pa.

[ * ] Notice: The portion of the term of this patent subsequent to Nov. 30, 2010 has been disclaimed.

[21] Appl. No.: 87,230

[22] Filed: Jul. 2, 1993

Related U.S. Application Data

[60] Division of Ser. No. 751,910, Aug. 29, 1991, Pat. No. 5,232,318, which is a continuation-in-part of Ser. No. 583,889, Sep. 17, 1990, abandoned.

[51] Int. Cl.⁶ .............................................. B24B 1/00
[52] U.S. Cl. ................................... 428/212; 428/457; 428/469; 428/472; 428/697; 428/699; 428/701; 428/702; 428/704; 428/698
[58] Field of Search ............... 428/212, 469, 472, 697, 428/698, 699, 457, 701, 702, 704

[56] References Cited

U.S. PATENT DOCUMENTS

| | | | |
|---|---|---|---|
| 3,755,866 | 9/1973 | Ohlsson | 407/119 |
| 4,035,541 | 7/1977 | Smith et al. | 407/119 X |
| 4,101,703 | 7/1978 | Schintlmeister | 428/216 |
| 4,268,569 | 5/1981 | Hale | 407/119 X |
| 4,402,994 | 9/1983 | Kobayashi et al. | 427/38 |
| 4,426,267 | 1/1984 | Munz et al. | 204/192 |
| 4,448,802 | 5/1984 | Buhl et al. | 427/42 |
| 4,449,895 | 5/1984 | Sarin et al. | 51/295 |
| 4,497,874 | 2/1985 | Hale | 428/551 |
| 4,610,931 | 9/1986 | Nemeth et al. | 428/547 |
| 4,640,869 | 2/1987 | Loth | 428/469 |
| 4,686,156 | 8/1987 | Baldoni, II et al. | 428/698 |
| 4,708,037 | 11/1987 | Buljan et al. | 82/1 C |
| 4,720,437 | 1/1988 | Chuoo et al. | 428/698 |
| 4,770,946 | 9/1988 | Yamauchi et al. | 428/626 |
| 4,776,863 | 10/1988 | van den Berg et al. | 51/307 X |
| 4,828,612 | 5/1989 | Yohe | 75/238 |
| 4,902,395 | 2/1990 | Yoshimura | 204/192.3 |
| 4,984,940 | 1/1991 | Bryant et al. | 407/119 |
| 5,075,181 | 12/1991 | Quinto et al. | 428/698 |
| 5,232,318 | 8/1993 | Santhanam et al. | 407/119 |
| 5,250,367 | 10/1993 | Santhanam et al. | 428/698 |
| 5,266,388 | 11/1993 | Santhanam et al. | 428/212 |

FOREIGN PATENT DOCUMENTS

| | | |
|---|---|---|
| 0166708A2 | 1/1986 | European Pat. Off. . |
| 0191554 | 8/1986 | European Pat. Off. . |
| 0149024 | 2/1987 | European Pat. Off. . |
| 0385283A2 | 9/1990 | European Pat. Off. . |
| 148349 | 5/1981 | German Dem. Rep. . |
| 53-025282 | 3/1978 | Japan . |
| 54-010491 | 1/1979 | Japan . |
| 54-073392 | 6/1979 | Japan . |
| 9038755 | 11/1979 | Japan . |
| 78158372 | 3/1981 | Japan . |
| 6152541 | 11/1981 | Japan . |
| 50798670 | 6/1982 | Japan . |
| 57-192259 | 11/1982 | Japan . |
| 57-192260 | 11/1982 | Japan . |
| 59-18474 | 4/1984 | Japan . |
| 62-009808 | 1/1987 | Japan . |
| 62-56564 | 3/1987 | Japan . |
| 62-192576 | 8/1987 | Japan . |
| 62-214166 | 9/1987 | Japan . |
| 62-270764 | 11/1987 | Japan . |

(List continued on next page.)

OTHER PUBLICATIONS

Buhl et al., "Tin Coatings On Steel," Thin Solid Films, vol. 80 (1981) pp. 265–270.

(List continued on next page.)

*Primary Examiner*—Archene Turner
*Attorney, Agent, or Firm*—John J. Prizzi

[57] ABSTRACT

Provided is a coated cutting tool having a coating and a substrate. The coating includes at least one CVD layer which may have a residual tensile stress and at least one layer having a high residual compressive stress. The outermost layer of the coating is preferably the one containing residual compressive stresses. The substrate is a composite having hard refractory grains.

12 Claims, 1 Drawing Sheet

FOREIGN PATENT DOCUMENTS

| | | |
|---|---|---|
| 01104773 | 4/1989 | Japan . |
| 01183310 | 7/1989 | Japan . |
| 02030406 | 1/1990 | Japan . |
| 0071906 | 3/1990 | Japan . |
| 02109619 | 4/1990 | Japan . |
| 1601224 | 4/1984 | United Kingdom . |

OTHER PUBLICATIONS

Munz et al., "A High Rate Sputtering Process for the Formation of Hard Friction–Reducing Tin Coatings on Tools," Thin Solid Films, vol. 96 (1982), pp. 79–86.

Komachi et al., "A Comparison of Residual Stresses in Cemented Carbide Cutting Tips Coated With Tin by the CVD & PVD Processes & their effect on Failure Resistance," Surfacing Journal Intl., vol. 1, No. 3 (1986) pp. 82–86.

Dearnley et al., "Evaluation of Failure Mechanisms of Ceramics & Coated Carbides used for Machining Stainless Steels," Surface Engineering, vol. 2, No. 3 (1986) pp. 191–202.

Wolfe et al., "The Role of Hard Coatings in Carbide Milling Tools," J. Vac. Sci. Technol., A3 (1986) pp. 2747–2754.

Quinto et al., "High Temperature Microhardness of Hard Coatings produced by Physical & Chemical Vapor Deposition," Thin Solid Films, vol. 153 (1987) pp. 19–36.

Jindal et al., "Load Dependence of Microhardness of Hard Coatings," Surface & Coatings Technology, vol. 36 (1988), pp. 683–694.

Jindal et al., "Adhesion Measurements of Chemically Vapor Deposited Hard Coatings on WC–Co Substrates," Thin Solid Films, vol. 54 (1987) pp. 361–375.

Rickerby et al., "Correlation of Process System Parameters with Structure & Properties of Physically Vapour–Deposited Hard Coatings," Thin Solid Films, vol. 157 (Feb. 1988) pp. 195–222.

Quinto et al., "Mechanical Properties, Structure & Performance of Chemically Vapour–Deposited & Physically Vapor Deposited Coating Carbide Tools," Materials Sci. & Eng., A105/A106 (1988) pp. 443–452.

Quinto, "Mechanical Property & Structure Relationships in Hard Coatings for Cutting Tools," J. Vac. Sci. Technol. A6(3), May/Jun. 1988, pp. 2149–2157.

Torok et al., "Young's Modulus of TiN, TiC, ZrN, and HsN," Thin Solid Films, 153 (1987) pp. 37–43.

American National Standard for Cutting Tools—Indexable Inserts—Identification (ANSI) B212.4–1986.

"Kennametal 181 Milling Cutters for Greater Productivity," Catalogue No. A80-105 (75) HO) (1980) pp. 1–92.

Bonetti et al., "CVD of Titanium Carbonitride at Moderate Temperatures," Surface Modification Technologies III (1990) proceedings held in Switzerland Aug. 28–Sep. 1, 1989, pp. 291–308.

"Mill With Coated Insects?Sure!" Modern Machine Shop, Oct. 1987, pp. 52–59. Ken Gettelman, Editor, Interview with James L. Hunt.

A. T. Santhanam et al., "Innovations in Coated Carbide Cutting Tools," Metal Powder Report, vol. 42, No. 12, Dec. 1987, pp. 840–845.

V. K. Sarin, "Cemented Carbide Cutting Tools," Advances in Powder Technology, Material Science Seminar, Louisville, Ky., ed. by G. Y. Chin (1981), pp. 253–288.

Japanese Industrial Standard JIS B4053 (1987) "Applications of Carbides for Machining by Chip Removal Designation".

Japanese Industrial Standard JIS B4104 (1978) "Cemented Carbide Tips".

International Standard ISO–R513–1975(E) "Application of Carbides for Machining by Chip Removal—Designation of the Main Groups of Chip Removal and Groups of Application".

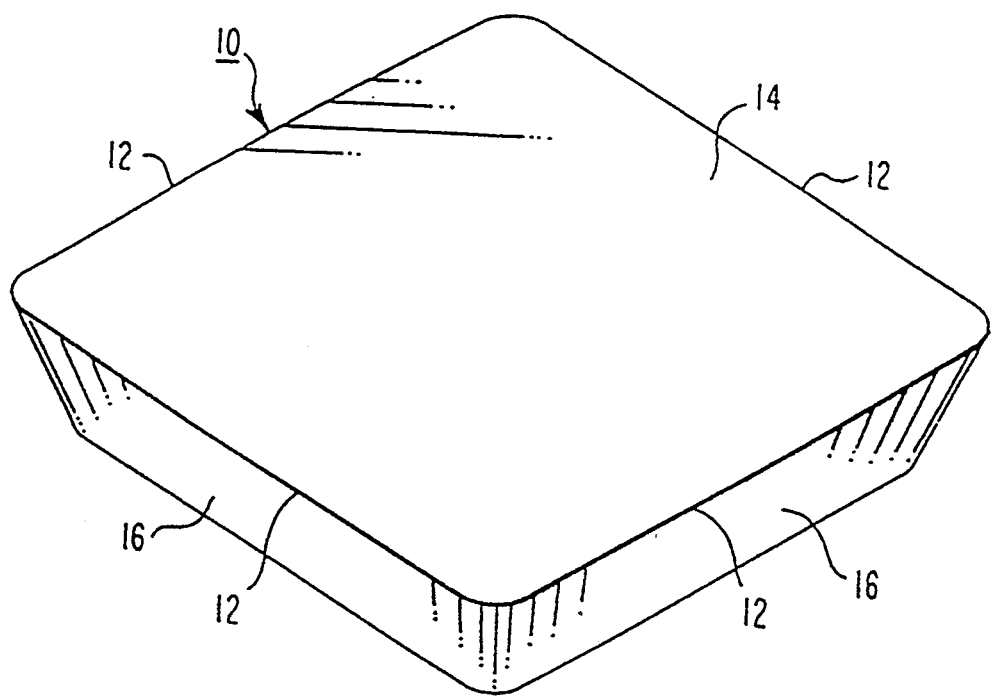

COATED CUTTING TOOLS

This is a divisional of application(s) Ser. No. 07/751,910, filed Aug. 29, 1991, now U.S. Pat. No. 5,232,318, which was a continuation-in-part of application Ser. No. 07/583,889, filed Sep. 17, 1990, now abandoned.

BACKGROUND OF THE INVENTION

The present invention relates to the field of coated hard refractory substrates, especially cutting tools.

In the past, cemented carbide cutting tools have been used in both a coated and an uncoated condition to machine metals and alloys. The application of a coating having one or more layers of a refractory material to a tungsten carbide-cobalt cemented carbide substrate has been used to improve the wear resistance and application range of cemented carbide cutting tools. In the past, refractory coatings, such as TiC, TiCN, TiN, and $Al_2O_3$, have been applied by CVD (chemical vapor deposition) techniques. In addition, TiN coatings have been applied by PVD (physical vapor deposition) techniques. Such CVD coatings deposited on cemented carbide substrates are characterized by thermal cracks, and residual tensile stresses. PVD TiN coatings are characterized by a dense, pore free structure without thermal cracks, and may have residual compressive stresses. The application of CVD coatings to cemented carbide substrates results in a reduction in the transverse rupture strength of the insert and, therefore, produces a greater susceptibility to chipping and breakage during use.

SUMMARY OF THE INVENTION

Applicants have now discovered that the transverse rupture strength of CVD coated cemented carbide may be improved by applying a PVD layer to the CVD coated substrate. In order to provide the aforementioned improvements, it is believed that the PVD coating must contain residual compressive stresses.

Therefore, in accordance with the present invention, improved cutting tools are provided having a substrate coated with one or more CVD layers, which may have a residual tensile stress, and one or more layers having a residual compressive stress. The outermost layer is preferably one having residual compressive stresses. Preferably, the compressive residual stress in the outermost layer exceeds 60 kg/mm$^2$, and more preferably, exceeds 130 kg/mm$^2$. In PVD TiN coatings, the compressive residual stress is preferably between about 60 to 340 kg/mm$^2$ and preferably, about 130 to 270 kg/mm$^2$. The substrate is a composite material having hard refractory grains (e.g., WC), preferably bonded together by a binder material, preferably, metallic (e.g., Co).

These and other aspects of the present invention will become more apparent upon review of the detailed specification in conjunction with the figure which is briefly described below:

BRIEF DESCRIPTION OF THE DRAWINGS

The FIGURE shows an isometric view of an embodiment of a cutting tool in accordance with the present invention.

DETAILED DESCRIPTION OF THE INVENTION

In accordance with the present invention, the figure shows a preferred embodiment of an indexable cutting insert 10 having cutting edges 12 at the junction of rake face 14 with flank faces 16. The cutting insert 10 shown in the figure is an SPGN-433 (ANSI B212.4-1986) which may be in a sharp, or preferably, honed cutting edge condition.

In a preferred embodiment, the substrate is a WC based cemented carbide substrate containing at least 70 weight percent WC, and more preferably, at least 80 weight percent WC. The binder is preferably cobalt or a cobalt alloy and, preferably, has a bulk concentration of 5 to 15 weight percent. More preferably, the bulk cobalt content is about 7 to about 13 weight percent, and most preferably, about 8 to about 12 weight percent. The substrate may also preferably contain solid solution carbide forming elements such as Ti, Hf, Zr, Nb, Ta, V, preferably selected from Ti, Nb and Ta alone or in combination with each other. These elements preferably may be added to the mix as an element, alloy, carbide, nitride or carbonitride. Preferably, the concentration of these elements is as follows: Ta 0–12 w/o; Ti 0–10 w/o and Nb 0–6 w/o. More preferably, the sum of Ta plus Nb is between about 3 to about 7 w/o and the titanium content is between about 0.5 to 10 w/o. Most preferably, the titanium content is about 1.5 to 4.0 w/o.

These elements form solid solution carbides with the WC in the substrate. Chromium, preferably as $Cr_3C_2$, may also be added in small amounts.

Bonded on to the substrate is a hard refractory coating having at least two layers, preferably a CVD layer and preferably a PVD layer, with the last PVD layer preferably being outside the last CVD layer. Applicants have found that, when the PVD layer also has a compressive residual stress, that the transverse rupture strength of the CVD coated article is significantly improved.

In a preferred embodiment, the inner CVD layer is preferably a refractory nitride, such as Ti, Zr or Hf nitride. Nitrides are preferred over refractory carbides or carbonitrides for the inner layer adjacent to the substrate in order to minimize he formation of eta phase ($Co_3W_3C$ and/or $Co_6W_6C$) at the cemented tungsten carbide based substrate peripheral boundary. Eta phase is a brittle phase which may make the cutting edge more susceptible to chipping. A second layer in the coating is preferably a CVD refractory carbonitride, or carbide, such as Ti, Zr or Hf carbonitride or carbide, because of the higher hardness and abrasion resistance of the carbides and carbonitrides of Ti, Zr and Hf compared to their nitrides. The CVD second layer and any additional CVD layers may include, for example, alumina, either as a single layer or multiple layers separated from each other by a layer of another refractory material, such as a nitride, carbonitride or carbide of Ti, Hf or Zr, preferably, Ti.

The CVD layer, or layers, typically has a residual tensile stress when applied to tungsten carbide based cemented carbides. However, CVD layers with low levels of residual compressive stress may be produced by using a CVD process such as the moderate temperature process described in Bonetti et al., "CVD of Titanium Carbonitride at Moderate Temperature: Properties and Applications," Proceedings of Surface Modification Technologies III Conference—Switzerland, Aug. 28–Sep. 1, 1989, TMS, 1990, Pages 291–308, to apply CVD TiCN. Alternatively, using conventional CVD procedures, HFN may be applied having low level residual compressive stresses.

Where it is desired to have an $Al_2O_3$ CVD layer immediately beneath the outer PVD layer, it is preferred, in order to improve the bond strength between the $Al_2O_3$ and the PVD layer that a CVD nitride, carbonitride or carbide layer of Ti, Hf or Zr is deposited between the alumina CVD layer and the PVD layer.

The final and outermost layer of the coating is preferably a hard refractory PVD layer, such as a nitride or carbonitride of Ti, Zr or Hf. This outermost layer is characterized by residual compressive stresses.

It should be understood that, while not a preferred option, the present invention may, however, include within its scope cutting tools having a CVD or other layer outside of the outermost PVD layer so long as the outermost layer is not deposited at a temperature which significantly reduces the residual compressive stresses in the PVD layer, thereby reducing the chipping resistance of the cutting tool.

The present invention is further illustrated by the following examples which are provided purely for illustration and not limitation.

The effect of coatings on the transverse rupture strength of cemented carbide substrate was demonstrated by applying the following coatings on a conventional WC-6 weight percent cobalt-0.5 weight percent $Cr_3C_2$ cemented carbide substrate.

Coatings

1. CVD {TiN (1 μm)/TiCN (3 μm)/TiN (4 μm)}
2. CVD {TiN (1 μm)/TiCN (3 μm) )/PVD TiN (4 μm)
3. PVD TiN (8 μm)

The CVD coatings were applied by conventional CVD techniques at about 950 to 1000 degrees Centigrade. The PVD TiN coating was applied with a Balzers BAI-830 (Balzers AG, Liechtenstein) ion plating PVD coating unit at about 500 degrees Centigrade using a titanium source and a nitrogen atmosphere (see U.S. Pat. No. 4,448,802). As is common practice during the initial stages of coating a very thin layer (detectable by high resolution TEM) of titanium was deposited on the CVD TiCN layer to provide improved adhesion between it and the PVD-TiN layer. The PVD layer produced by this technique has compressive residual stresses.

The transverse rupture strength of transverse rupture bars coated as described above and in an uncoated condition were measured using the ASTM standard B406 transverse rupture test procedure. The transverse rupture strength data are given below in Table I.

TABLE I

| | Average TRS (ksi) | Standard Deviation (ksi) |
| --- | --- | --- |
| Uncoated | 559 | 27 |
| Coating 1 (CVD) | 193 | 12 |
| Coating 2 (CVD + PVD) | 281 | 11 |
| Coating 3 (PVD) | 566 | 58 |

As shown by the examples, the application of CVD layers to a cemented carbide substrate results in a drastic decrease in transverse rupture strength. This reduction is believed to be due to: (a) the high temperature annealing effect of the CVD deposition temperature (950–1000 degrees Centigrade) which reduces beneficial compressive residual stresses in the surface due to grinding of the cemented carbide substrate; and (b) the presence of thermal cracks and residual tensile stresses in the CVD layers caused by thermal expansion mismatch between the coating and the cemented carbide substrate.

The deposition of PVD TiN over the CVD (TiN/TiCN) partially restores the loss in TRS observed with CVD coating alone. This improvement (about 45 percent) in TRS is believed to be due to the presence of compressive residual stresses and the absence of thermal cracks within the outer PVD TiN layer.

It, therefore, follows that a coating of solely PVD should not degrade transverse rupture properties. This is shown by the results of the samples coated with coating 3.

It is the applicants' belief that, in view of the above results, combinations of CVD coatings and coatings having high compressive residual stresses coatings may be applied to a variety of substrates to obtain improvements in the overall properties and performance of the material. Examples of the substrates which may be used include WC based cemented carbides, Ti(C,N) based cermets, and ceramics such as alumina, silicon nitride and sialon based (i.e., >50 v/o) materials with or without a ceramic particulate (e.g., $ZrO_2$, WC, TiC, TiCN and/or TiN) and/or a ceramic whisker (e.g., SiC, TiC, TiCN and/or TiN) reinforcement phase dispersed therein. It is contemplated that this invention may be used to its best advantage in cemented carbides where the cobalt content of the substrate is preferably 7 to 13 weight percent and, more preferably, 8 to 12 weight percent. Specific examples of cemented carbide substrates where the present invention may be applied are as follows:

Substrate 1 11.5 w/o Co, 2.5 w/o Ta (Nb)C, 86 w/o WC-89.8 $R_A$, Hc 160 Oe, A and/or B porosity Substrate 2 6.0 w/o Co, 0.5 w/o $Cr_3C_2$, 93.5 w/o WC-93 $R_A$, Hc 300 Oe, A and/or B porosity (used in Table I examples)

Substrate 3 9.75 w/o Co, 90.25 w/o WC- 91 $R_A$, Hc 200 Oe, A and/or B porosity

Substrate 4 10 w/o Co, 90 w/o WC-89 $R_A$, Hc 120 Oe, A and/or B porosity

Substrate 5 10.5 w/o Co, 10 w/o Ta(Nb)C, 7 w/o TiC, 72.5 w/o WC-91.4 $R_A$, Hc 180 Oe, A and/or B porosity Substrate 6 8.5 w/o Co, 11 w/o Ta(Nb)C, 7.5 w/o TiC, 73 w/o WC-91.2 $R_A$, Hc 140 Oe, A and/or B porosity For further illustration, binder enriched substrates were made by the following procedures and then coated with various layers as described below to produce SPGN-433 style inserts.

The substrate powder was produced in a two stage milling procedure as illustrated in Table II In the first stage, the components were added to a four foot diameter by 5 foot long mill jar with 3400 kilograms of cemented tungsten carbide cycloids along with 130 gallons of heptane and milled for 18 hours to a Fisher Apparent Particle Size of 1.05 μm. The second stage components along with 95 gallons of heptane were then added and the mix was ball milled an additional 12 hours to a Fisher Apparent Particle Size of 1.05 μm.

TABLE II

| | Material | Size | Weight % of Charge | Chemistry Weight % | | | | | |
|---|---|---|---|---|---|---|---|---|---|
| | | | | C | Co | Ta | Ti | Nb | W |
| Stage 1 | WC | −40 Mesh | 53.8 | 3.32 | 3.91 | 3.66 | 2.00 | 0.37 | Rem. |
| | TiN | 1.3 μm | 2.0 | — | — | — | 1.50 | — | — |
| | TaNbC | −40 Mesh | 1.7 | 0.13 | — | 1.09 | — | 0.48 | — |
| Stage 2 | Co | 1.5– 2.0 μm | 2.1 | — | 2.10 | — | — | — | — |
| | WC | 1.8– 2.2 μm | 40.4 | 2.47 | — | — | — | — | Rem. |
| | C | | <.1 | .25 | — | — | — | — | — |
| TOTAL | | | 100 | 6.17 | 6.01 | 4.75 | 3.50 | 0.85 | Rem. |

Mill charge was then spray dried. SPGN-433 style insert substrates were then pressed and sintered. Sintering was performed at about 2650 degrees Fahrenheit for about 30 minutes under a vacuum. The resulting sintered substrates had their flank and rake faces ground, during which the binder enriched zone was removed. The cutting edges of some of the substrates were then honed, while in other substrates, the cutting edges were left in a sharp condition. The substrates were then resintered at 2650 degrees Fahrenheit for about 30 minutes in vacuum to again provide a cobalt enriched zone beneath both the flank and rake peripheral boundaries of the substrate. The base was then ground to insure flatness. The resulting substrates had a magnetic saturation value of 90 percent, indicating the absence of C type porosity, and a magnetic coercive force value, $H_c \xlongequal{} 191$ oersted. Substrates of this type typically have a bulk hardness of about 92 Rockwell A and A-type porosity with possibly minor amounts of B-type porosity. Evaluation of the substrate by energy dispersive spectroscopy showed a binder enriched zone near a peripheral boundary of the substrate having a thickness of about 20 to 25 μm and having a maximum cobalt concentration averaging about 12.7 w/o or averaging about 200 to 210 percent of the bulk substrate concentration.

The substrates were then coated with the CVD and PVD layers described in the following examples. The CVD coating techniques used were conventional in nature. First, a CVD TiN layer was applied to the substrate, and then a CVD-TiCN layer was applied on top of the CVD TiN layer. These layers were deposited between 950 and 1000 degrees Centigrade.

After the CVD TiCN layer, all surfaces (i.e., the rake and flank surfaces) except for the bottom surface, were coated with a PVD layer of TiN as described before.

Residual stresses in the outermost TiN layer and in the WC of the substrate of the following inserts were analyzed:

1. Enriched substrate (made as described above)+CVD (TIN(1 μm)/TiCN(3 μm))+PVD TiN (4 μm)
2. Enriched substrate (made as described above)+CVD (TIN(1 μm)/TiCN(3 μm))/TiN(4 μm))
3. Nonenriched substrate B (see Table 3)+CVD (TiN (1 μm)/TiCN (3 μm) )+PVD TiN (4 μm)
4. Nonenriched substrate B+CVD (TiN(1 μm)/TiCN(3 μm)/TiN(4 μm))

The $\sin^2 \psi$ method of residual stress measurement was performed on the rake face of a sample of each of the foregoing inserts. The $\psi$ angles used were as follows: 0, 21, 30, 38, 45, 52, −21, −30, −45, −52. All the data were collected on a Rigaku DMAX diffractometer with a stress measurement attachment (manufactured by Rigaku of OSAKA, Japan). Conventional peak fitting methods were used to analyze the x-ray diffraction peaks. The data were then fed into a Rigaku stress analysis program. In performing the analysis, the following mechanical properties were assumed: for WC—Poisson Ratio=0.2 and-Young's Modulus=700 GPa; and for TiN—Poisson Ratio=0.2 and Young's Modulus=640 GPa. The peak reflections analyzed were the {211} reflection for WC and the {422} and {511} reflections for TiN. The residual stress was then calculated using a least squares fit to the peak data. This analysis showed that, where the outermost layer was a CVD TiN layer, it was under a residual tensile stress, but where the outermost layer was a PVD TiN layer, it was under a residual compressive stress. In all cases, the WC in the substrate had a residual compressive stress.

Additional residual stress measurements were made using the $\sin^2 \psi$ method described above in order to provide a quantitative estimate of the levels of compressive and tensile stresses in the various coatings. These measurements are listed in Table III.

TABLE III

| | RESIDUAL STRESS (in kg/mm$^2$) | | | | | |
|---|---|---|---|---|---|---|
| | WC | | TiN | | TiCN | |
| SAMPLE NO. | x | σ | x | σ | x | σ |
| 5. Enriched substrate CVD-TiN/TiCN/TiN[1] | 31.9 ± 6.6 compressive | | 31.8 ± 1.4 tensile | | 114 ± 43 tensile | |
| 6. Enriched substrate CVD TiN/TiCN + PVD TiN[1] | 14.4 ± 5.1 compressive | | 203 ± 70 compressive | | 92.8 ± 6.3 tensile | |
| 7. Nonenriched Substrate A CVD TiN/TiCN/TiN[1] | 5.7 ± 17.8 compressive | | 71.1 ± 4.2 tensile | | 65.6 ± 9.4 tensile | |
| 8. Nonenriched Substrate A CVD TiN/TiCN-PVD-TiN[1] | 39.3 ± 21 compressive | | 151 ± 40 compressive | | 43.5 ± 12 tensile | |
| 9. Nonenriched Substrate B | 85.7 ± 6.4 compressive | | 293 ± 57 compressive | | — | |

TABLE III-continued

| | RESIDUAL STRESS (in kg/mm$^2$) | | | | | |
|---|---|---|---|---|---|---|
| | WC | | TiN | | TiCN | |
| SAMPLE NO. | x | σ | x | σ | x | σ |
| PVD TiN (4 μm) | | | | | | |

[1]The TiN/TiCN/TiN coating layers have a thickness of 1 μm, 3 μm and 4 μm, respectively, with the innermost coating being 1 μm CVD TiN.

x is the residual stress measured from the slope of least squares fit to the peak data and σ = standard deviation.

For TiCN, the {422} reflection was analyzed. Poisson Ratio and Young's Modulus for TiCN were assumed to be 0.2 and 550 GPa, (interpolated value), respectively.

Substrate A ≃ WC based cemented carbide with 10.5 w/o Co, 7 w/o Ta, 5.5 w/o Ti, 2.5 w/o Nb, $R_A$ ≃ 91.4, Hc ≃ 180, A porosity.

Substrate B ≃ WC based cemented carbide with 8.5 w/o Co, 10 w/o Ta, 6 w/o Ti, $R_A$ ≃ 91.2, Hc ≃ 150, A porosity.

It should be noted that the stress measurements on TiN made in coatings which contain both a CVD and a PVD TiN layer is the result of contributions from both layers. Therefore, for Sample No. 6 in Table III, which is in accordance with the present invention, it can be said that the outer PVD TiN layer has a compressive residual stress in excess of about 203 kg/mm$^2$ since it is believed that the compressive residual stress value has been reduced by the innermost CVD TiN layer, which we believe to be under a residual tensile stress. However, it is believed that the contribution from the CVD TiN layer to this residual stress value is expected to be far less than that from the PVD layer, because the CVD layer, being deeper and thinner, is sampled less extensively by the incident x-ray beam. If the standard deviation is also considered, then it may be said that the compressive residual stresses in the outermost PVD TiN layer should preferably exceed about 60 kg/mm$^2$ ($x-2\sigma$), and more preferably, exceed about 130 kg/mm$^2$ ($x-\sigma$).

The magnitude of the upper limit on the actual stresses in the outermost PVD TiN layer of Sample No. 6 can be estimated by looking at Sample No. 9, which has only a PVD TiN layer and a compressive residual stress of 293±57 kg/mm$^2$ and by looking at Sample No. 5, which has two layers of CVD TiN and a tensile residual stress in these layers of 31.8±1.4 kg/mm$^2$. The inventors, therefore, believe it is reasonable to conclude that residual compressive stresses, of the outer PVD TiN layer, Sample No. 6, should be preferably between about 60 to 340 ($x\pm2\sigma$), and more preferably, between about 130 to 270 ($x\pm\sigma$) kg/mm$^2$.

It is also worth noting that, despite the high compressive residual stresses in the outer PVD TiN layer of Sample No. 6, the middle layer of CVD TiCN remains in a state of residual tensile stress.

CVD and PVD coated binder enriched substrates and other embodiments of the present invention are described in copending application U.S. Ser. No. 07/583,544 entitled "Binder Enriched CVD and PVD Coated Cutting Tool," filed on Sep. 17, 1990 now U.S. Pat. No. 5,250,367, and copending application U.S. Ser. No. 07/751,942 entitled "Binder Enriched Coated Cutting Tool," filed on Aug. 29, 1991 now U.S. Pat. No. 5,266,388. These copending applications describe the application of these cutting inserts to milling of steel and shows the superiority of binder enriched grades over nonenriched grades in the severe milling applications described therein. The present applicants believe that, for less severe milling applications and turning applications, the application of compressive and tensile residual stress coatings to nonenriched substrates as described in the present application should be sufficient to provide improved chipping resistance.

All applications, patents and other documents referred to herein are hereby incorporated by reference.

Other embodiments of the invention will be apparent to those skilled in the art from a consideration of this specification or practice of the invention disclosed herein. It is intended that the specification and examples be considered as exemplary only, with the true scope and spirit of the invention being indicated by the following claims.

What is claimed is:

1. An article of manufacture comprising:
   a CVD coated substrate;
   a PVD coating on said CVD coated substrate thereby providing said article of manufacture with a transverse rupture strength which is greater than the transverse rupture strength of said CVD coated substrate; and
   wherein said substrate is a composite having hard refractory grains.

2. The article of manufacture according to claim 1 wherein the PVD coating is in a state of residual compressive stress.

3. An article of manufacture comprising:
   a substrate having a first coating layer thereon;
   wherein said first coating is a CVD layer;
   a second coating layer applied on said first coating layer;
   wherein said second coating layer is in a state of residual compressive stress, thereby improving the transverse rupture strength of said coated substrate having said first coating layer thereon;
   wherein said substrate is a composite having hard refractory grains; and
   wherein said residual compressive stress exceeds 60 kg/mm$^2$.

4. The article of manufacture according to claim 3 wherein said CVD layer is in a state of residual stress.

5. The article of manufacture according to claim 3 wherein said second coating layer has a compressive residual stress of at least about 130 kg/mm$^2$.

6. The article of manufacture according to claim 3 wherein said second coating layer has a compressive residual stress of between about 60 to about 340 kg/mm$^2$.

7. The article of manufacture according to claim 3 wherein the second coating layer has a compressive residual stress between about 130 to about 270 kg/mm$^2$.

8. The article of manufacture according to claim 2 wherein said PVD coating has a compressive residual stress of at least about 130 kg/mm$^2$.

9. The article of manufacture according to claim 2 wherein said PVD coating has a compressive residual stress of between about 60 to about 340 kg/mm$^2$.

10. The article of manufacture according to claim 2 wherein the PVD coating has a compressive residual stress between about 130 to about 270 kg/mm$^2$.

11. The article of manufacture according to claim 3 wherein the second coating layer is characterized by an absence of thermal cracks.

12. The article of manufacture according to claim 2 wherein said PVD coating is characterized by an absence of thermal cracks.

* * * * *